United States Patent
Tose et al.

(10) Patent No.: US 6,602,946 B2
(45) Date of Patent: *Aug. 5, 2003

(54) PHOTOSENSITIVE INSULATING PASTE AND THICK FILM MULTI-LAYER CIRCUIT SUBSTRATE

(75) Inventors: Makoto Tose, Moriyama (JP); Hiromichi Kawakami, Moriyama (JP); Shizuharu Watanabe, Omihachiman (JP)

(73) Assignee: Murata Manufacturing Co. (JP)

( * ) Notice: Subject to any disclaimer, the term of this patent is extended or adjusted under 35 U.S.C. 154(b) by 33 days.

This patent is subject to a terminal disclaimer.

(21) Appl. No.: 09/915,704

(22) Filed: Jul. 26, 2001

(65) Prior Publication Data

US 2002/0035194 A1 Mar. 21, 2002

Related U.S. Application Data

(62) Division of application No. 09/496,159, filed on Feb. 1, 2000, now Pat. No. 6,403,694.

(30) Foreign Application Priority Data

Feb. 17, 1999 (JP) .............................................. 11-38762

(51) Int. Cl.$^7$ ................................................... C08K 3/34
(52) U.S. Cl. ........................ 524/493; 524/492; 428/210; 428/325; 428/331; 501/20; 501/21; 501/65
(58) Field of Search ................................. 524/492, 493; 428/210, 325, 331; 501/20, 21, 65

(56) References Cited

U.S. PATENT DOCUMENTS 6,365,265 B1 * 4/2002 Tose et al. .................. 428/210

* cited by examiner

Primary Examiner—Edward J. Cain
(74) Attorney, Agent, or Firm—Dickstein, Shapiro, Morin & Oshinsky, LLP.

(57) ABSTRACT

A photosensitive insulating paste contains a borosilicate glass powder and a crystalline $SiO_2$ powder, wherein the powders are dispersed in a photosensitive organic vehicle and the paste contains the crystalline $SiO_2$ component in an amount of about 3–40 wt. % after sintering. A thick-film multi-layer circuit substrate (e.g., chip inductor) comprising an insulating substrate on which insulating layers are formed, wherein the insulating layers are formed through exposure, development and sintering, after the application of the photosensitive insulating paste.

17 Claims, 4 Drawing Sheets

PHOTOSENSITIVE INSULATING PASTE AND THICK FILM MULTI-LAYER CIRCUIT SUBSTRATE

This is a divisional of U.S. patent application Ser. No. 09/496,159, filed Feb. 1, 2000, now U.S. Pat. No. 6,403,694, filed in the name of Makoto Tose, et al. and entitled PHOTOSENSITIVE INSULATING PASTE AND THICK-FILM MULTI-LAYER CIRCUIT SUBSTRATE.

BACKGROUND OF THE INVENTION

1. Field of the Invention

The present invention relates to a photosensitive insulating paste suitable for forming an insulating layer in, for example, a high-frequency circuit, and to a thick-film multi-layer circuit substrate containing the paste.

2. Description of the Related Art

As high-frequency electronic apparatuses, including portable terminals and computers, have come to have a higher density and a higher signal speed, insulating materials used in high-frequency circuits or like elements of the apparatuses are required to have lower relative dielectric constants and higher Q values. Such insulating materials are primarily used for forming an insulating layer that separates two or more electrodes or transmission lines in, for example, a high-frequency circuit substrate or an electronic component for a high-frequency circuit.

Generally, the insulating layer is formed of an insulation paste containing glass powder or a similar material. The insulating layer often contains via holes in the form of micro-pores for electrically connecting electrodes and circuits, such as those formed by transmission lines, which are disposed on the upper and lower surfaces of the layer. The insulating layer containing via holes is formed through the following procedure, for example. An insulating paste is applied onto a substrate by way of printing at a predetermined position by means of a technique such as screen printing, and the paste is dried. Subsequently, via holes are formed in the paste and the paste is fired to thereby form the insulating layer.

A technique making use of a photosensitive insulating paste is also known as a technique for forming via holes in a dried insulating paste. In the technique, an insulating paste containing a photosensitive resin such as a photosensitive polyimide resin is used and micro-via holes are formed in the paste by means of photolithography.

For example, Japanese Patent Application Laid-Open (kokai) Nos. 110466/1997 and 50811/1996 disclose a process for forming micro-via holes in an insulating paste. In the process, a glass material containing $SiO_2$, $Al_2O_3$, $B_2O_3$, $Bi_2O_3$ and ZnO or a glass material containing $Bi_2O_3$, $SiO_2$, $B_2O_3$, BaO and ZnO is dispersed in a photocurable organic vehicle to thereby obtain a photosensitive insulating paste, the paste is applied to a substrate and the via-holes are formed by means of a photolithography technique in electronic elements for forming circuits which require multi-layer wiring.

Examples of insulating materials used for forming the above-described insulating layer include a resonator material such as Ba—Nd—Pb—Ti—O having a high Q value in a high-frequency region and an alumina-borosilicate glass ceramic material having a low dielectric constant.

However, the technique making use of screen printing may cause some problems, such as bleeding due to the viscosity of the insulating paste and poor printing resolution attributable to a printing plate. Therefore, an insulating layer containing micro-via holes having a diameter of less than 150 μm is difficult to form, and thus, a circuit substrate and electronic components for a circuit have not fully satisfied the demand for reduction in size and enhancement of density.

Meanwhile, the technique for forming an insulating layer through a photolithography technique by use of a photosensitive insulating paste enables formation of micro-via holes having a diameter of less than 150 μm. However, the thus-obtained insulating layer has poor durability at high temperature and low plating-resistance to an acidic plating solution.

Particularly, glass materials disclosed in Japanese Patent Application Laid-Open (kokai) Nos. 110466/1997 and 50811/1996 are difficult to form into an insulating layer having high reliability when an Ag-type conductive material is used for forming transmission lines or electrodes adjacent to an insulating layer formed of the glass materials, since the Ag-type conductive material is highly reactive with the insulating layer. In addition, an ion cross-linking reaction may occur between the organic binder and a glass powder. For example, even when a glass powder is stabilized by use of a triazole, the viscosity of a photosensitive insulating paste may decrease with passage of time and consistent patterns may not be formed.

Meanwhile, a resonator material such as Ba—Nd—Pb—Ti—O has a high Q value but has a relatively high relative dielectric constant (εr). Further, materials having a low dielectric constant, typified by an alumina-borosilicate glass ceramic material, has a limitation in terms of increasing Q value.

SUMMARY OF THE INVENTION

To overcome the above described problems, preferred embodiments of the present invention provide a photosensitive insulating paste which enables formation of very small via holes (hereinafter referred to as micro-via holes) as well as a film in a stable manner.

Preferred embodiments of the present invention also provide a thick-film multi-layer circuit substrate containing the above-described paste, which substrate is highly reliable and has an insulating layer having a high Q value and a low relative dielectric constant, wherein the density of circuit patterns is increased.

Accordingly, in a first aspect of the present invention, there is provided a photosensitive insulating paste comprising a borosilicate glass powder and a crystalline $SiO_2$ powder, which powders are dispersed in a photosensitive organic vehicle, wherein the paste contains crystalline $SiO_2$ in an amount of about 3–40 wt. % after sintering.

Preferably, the borosilicate glass contains $SiO_2$, $B_2O_3$ and $K_2O$, wherein the compositional proportions of the three components represented by ($SiO_2$, $B_2O_3$, $K_2O$) fall within a region formed by connecting points A (65, 35, 0), B (65, 20, 15), C (85, 0, 15), and D (85, 15, 0) in the ternary diagram shown in FIG. 1.

Preferably, the borosilicate glass powder and the crystalline $SiO_2$ powder have a mean particle size of 0.1–5 μm.

Preferably, the organic vehicle contains an organic binder, a photopolymerization initiator and a photocurable monomer, and the organic binder is an acrylic copolymer having a carboxyl group and an ethylenic unsaturated group in side chains of the copolymer. Preferably, the acrylic copolymer is an acrylic/modified-cellulosic copolymer.

Preferably, the acrylic/modified-cellulosic copolymer has a compositional ratio of about 3/1–10/1.

In the photosensitive insulating paste as described in relation to the first aspect of the present invention, when the ratio of surface area to weight is represented by SS (m$^2$/g), the ratio of surface area to volume is represented by CS (m$^2$/cc) and specific gravity is represented by $\rho$, the borosilicate glass powder and the crystalline SiO$_2$ powder have a shape-smoothness index ($\rho \times$SS/CS) of about 1.0–3.0.

In a second aspect of the present invention, there is provided a thick-film multi-layer circuit substrate comprising an insulating substrate and an insulating layer formed thereon through thick-film printing, wherein the insulating layer is formed through exposure, development and sintering, after application of the photosensitive insulating paste described in relation to any one of the features or embodiments described above.

In the thick-film multi-layer circuit substrate according to the second aspect of the present invention, the insulating layer is provided between a first conductive layer and a second conductive layer, which conductive layers being formed to have predetermined circuit patterns, wherein the insulating layer contains via holes electrically connecting the first conductive layer with the second conductive layer.

Since the photosensitive insulating paste as described in relation to the first aspect of the present invention comprises a borosilicate glass powder and a crystalline SiO$_2$ powder, which powders are dispersed in a photosensitive organic vehicle such that the paste contains crystalline SiO$_2$ in an amount of about 3–40 wt. % after sintering, the crystalline SiO$_2$ powder contained in such a high amount has low reactivity with an organic binder and the like, and therefore the viscosity of the paste hardly changes with passage of time and a film can be formed in a consistent manner. In addition, micro-via holes can be formed on the film by means of a photolithography technique.

Also, since the thick-film multi-layer circuit substrate as described in relation to the second aspect of the present invention is formed by use of an insulating layer which is prepared from the photosensitive insulating paste of the present invention and which contains a crystalline SiO$_2$ component in the above-described predetermined amount, the layer has a high Q value and a low relative dielectric constant in good balance. In addition, micro-via holes of good shape can be formed on the layer by means of a photolithography technique, and the densities of via holes and circuit patterns can be increased.

DESCRIPTION OF PREFERRED EMBODIMENTS

The photosensitive insulating paste of the present invention, which relates to the first aspect of the invention, will next be described in detail.

The insulating layer formed of the photosensitive insulating paste of the present invention contains a crystalline SiO$_2$ component in an amount of about 3–40 wt. % after sintering. The amount of the SiO$_2$ component is limited to the above range because when the amount is in excess of about 40 wt. %, the layer is not sintered at a temperature of 1000° C. or less, whereas when the amount is less than about 3 wt. %, the crystalline SiO$_2$ may provide an insignificant effect in enhancement of the Q value.

Figure 1:
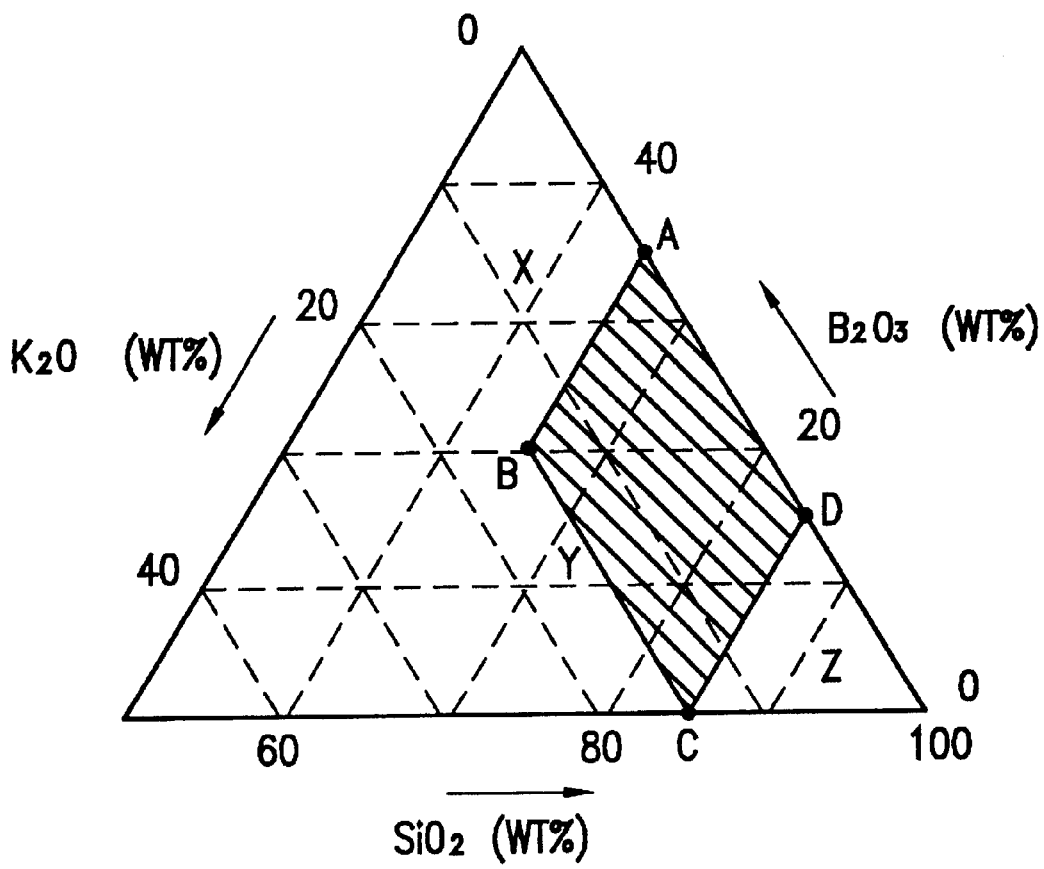
FIG. 1 is a ternary diagram showing a compositional region of a borosilicate glass powder contained in a photosensitive insulating paste of the present invention.

In the photosensitive insulating paste of the present invention, the borosilicate glass powder serving as a insulating material contains SiO$_2$, B$_2$O$_3$ and K$_2$O, and the compositional proportions of the three components represented by (SiO$_2$, B$_2$O$_3$, K2O) preferably fall within a region formed by connecting points A (65, 35, 0), B (65, 20, 15), C (85, 0, 15), and D (85, 15, 0) in the ternary diagram shown in FIG. 1.

When the compositional proportions of the borosilicate glass powder fall within a region formed by connecting points A, B, C and D in the ternary diagram shown in FIG. 1, the borosilicate glass powder contains a large amount of SiO$_2$ and a relatively small amount of a component having high reactivity (ion cross-linking) with a photosensitive organic vehicle, particularly a photosensitive organic binder having a carboxyl group. Therefore, the viscosity of the photosensitive insulating paste containing the insulating material and the organic vehicle hardly changes with passage of time and a film can be formed stably through a variety of techniques. In addition, micro-via holes having good shape can be formed on the layer with ease by means of a photolithography technique.

The insulating layer—formed of the photosensitive insulating paste predominantly comprising the borosilicate glass powder having the above-described composition and the crystalline SiO$_2$ powder—has a particularly low relative dielectric constant $\epsilon r$ of less than 7 and a high Q value of 200 or more at a frequency of 3 GHz. In addition, the photosensitive insulating paste contains a large amount of SiO$_2$ glass having low reactivity with a photosensitive organic binder, and the viscosity of the paste hardly decreases with passage of time and a film can be stably formed from the paste. Therefore, the paste is suitably used for forming a circuit substrate having a high-frequency transmission line and an insulating layer of a variety of electronic components.

In contrast, an insulating layer in region X in the ternary diagram shown in FIG. 1 provides low insulation resistance in a wet loading test, resulting in a tendency to provide unreliable insulation. In region Y in the ternary diagram shown in FIG. 1, the relative dielectric constant $\epsilon r$ becomes high, which is a disadvantage particularly when the paste is used in as an insulating layer in high-frequency electronic components. Moreover, in region Z in the ternary diagram shown in FIG. 1, the glass softening point is high, the sintering temperature is also high, and in addition, the layer tends to be difficult to sinter together with a low-melting-point metal having a small specific resistance, such as silver or copper.

In the photosensitive insulating paste of the present invention, the borosilicate glass powder and the crystalline SiO$_2$ powder preferably have a mean particle size of about 0.1–5 $\mu$m.

When these inorganic powders (the borosilicate glass powder and the crystalline SiO$_2$ powder) have a mean particle size of less than about 0.1 $\mu$m, reflected and scattered light from micronized inorganic particles may cause deteriorated resolution of via holes when exposure of the insulating layer formed of the photosensitive insulating paste. In contrast, when these inorganic powders have a mean particle size in excess of about 5 μm, the shape of a via hole becomes poor. Particularly, the particles in excess of about 5 μm may cause a decrease in roundness of via holes and a decrease in dielectric breakdown voltage.

In the photosensitive insulating paste of the present invention, when the ratio of surface area to weight is represented by SS ($m^2$/g), the ratio of surface area to volume is represented by CS ($m^2$/cc) and specific gravity is represented by ρ, the borosilicate glass powder and the crystalline $SiO_2$ powder preferably have a shape-smoothness index (ρ×SS/CS) of about 1.0–3.0.

When these inorganic powders are treated to have a shape-smoothness index (ρ×SS/CS) of about 1.0–3.0, the irregularities on the surfaces of these inorganic particles become low and the amount of scattered light decreases during exposure of the insulating layer, and thus, the layer may provide via holes having a high degree of roundness and small taper. When these inorganic powders have a shape-smoothness index of about 1.0–2.0, the sintered layer has a further improved density and an excellent Q value, which is particularly preferred.

In order to provide these inorganic powders with a shape-smoothness index of about 1.0–3.0, the powders may undergo several treatments, for example, a treatment wherein the powders are sprayed in a high temperature atmosphere and rapidly cooled, an etching treatment, and a treatment wherein a sol of the powders is sprayed in a flame and rapidly cooled. These powders may be subjected to repeated treatments when the desired shape-smoothness index is difficult to obtain by one treatment. In addition, the powders may be subjected to different treatments performed in combination.

In the photosensitive insulating paste of the present invention, the photosensitive organic vehicle contains an organic binder, a photopolymerization initiator and a photocurable monomer, and the organic binder is preferably an acrylic copolymer having a carboxyl group and an ethylenic unsaturated group in the side chains.

When an acrylic copolymer having a carboxyl group and an ethylenic unsaturated group in the side chains is used as the organic binder, an aqueous solution of organic alkalis such as monoethanolamine or of metallic alkali such as sodium carbonate can be used as a developing solution. Therefore, use of organic solvents having high toxicity, such as xylene, isoamyl acetate, butyl acetate and toluene, is not required. The photopolymerization initiator and a photocurable monomer may contain known photosensitive components.

The acrylic copolymer is preferably an acrylic/modified-cellulosic copolymer, and the acrylic/modified-cellulosic copolymer preferably has a compositional ratio of about 3/1–10/1.

When an acrylic/modified-cellulosic copolymer is used as an acrylic copolymer having a carboxyl group and an ethylenic unsaturated group in the side chains, and the acrylic/modified-cellulosic copolymer has a compositional ratio of about 3/1–10/1, a photosensitive insulating paste layer exhibiting high strength after drying can be formed, wherein via holes have good shape with a low degree of deformation. When the amount of acrylic monomer is in excess of the above range, the photosensitive insulating paste layer weakly adheres to the substrate after the layer is dried and the strength of the resultant film may decrease. In contrast, when the amount of modified-cellulosic monomer is in excess of the above range, the modified-cellulosic monomer absorbs active rays during exposure, and via holes may be deformed to a great extent.

As is described above, by use of the photosensitive insulating paste of the present invention, the insulating layer having micro-via holes may be formed by means of a photolithography technique, which holes are difficult to form through printing. The paste contains borosilicate glass powder and crystalline $SiO_2$ powder serving as an insulating material, and the insulating layer containing these inorganic powders is formed after the paste is sintered. Therefore, the thus-formed layer has high durability at high temperature and high plating-resistance to an acidic plating solution as compared with a resin insulating layer.

The thick-film multi-layer circuit substrate of the present invention, which relates to the second aspect of the invention, will next be described in detail.

The thick-film multi-layer circuit substrate of the present invention comprises an insulating substrate and an insulating layer formed thereon through thick-film printing. In order to form the insulating layer, the photosensitive insulating paste of the present invention is applied to the insulating substrate and the substrate is subjected to photolithography including exposure and development, and sintering.

The insulating layer formed of the photosensitive insulating paste of the present invention can be sintered at a relatively low temperature and has a low relative dielectric constant. In addition, the coefficient of thermal expansion of the layer can be set in accordance with the characteristics of the substrate and the circuit pattern, and thus, a thick-film multi-layer circuit substrate having excellent high-frequency characteristic and high reliability with suppressed camber can be obtained.

When the insulating layer contains via holes electrically connecting the first conductive layer with the second conductive layer, as is described above, the insulating layer having micro-via holes, which are difficult to obtain through printing, can be formed at high accuracy. In addition, a thick-film multi-layer circuit substrate having a large number of layers and high density can be produced with ease.

The thick-film multi-layer circuit substrate of the present invention will next be described by reference to a chip coil serving as an example.

Figure 2:
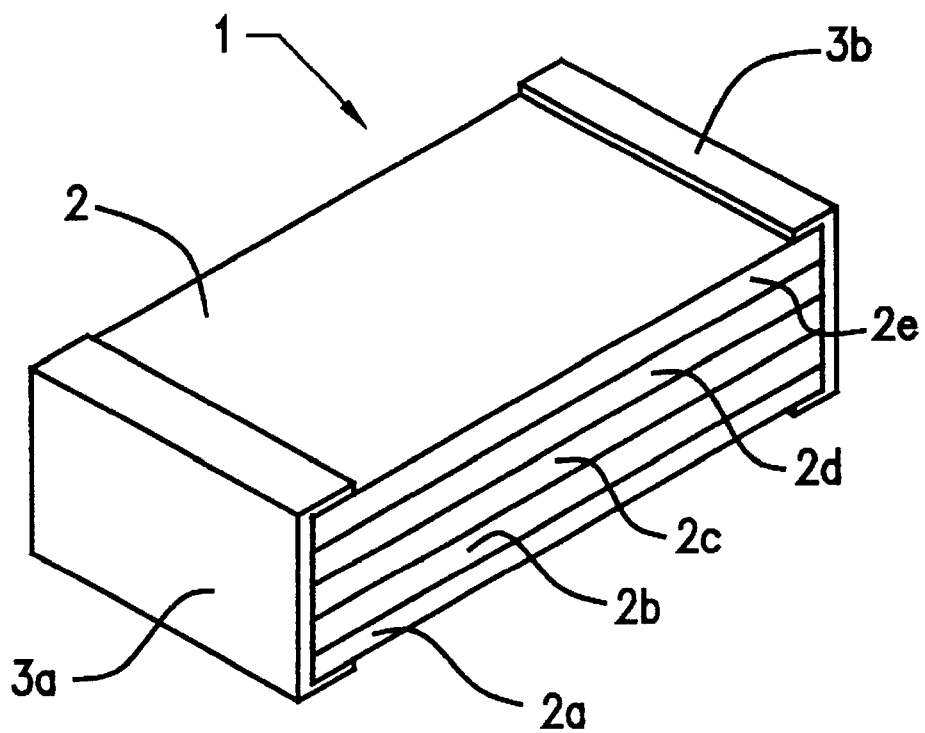
FIG. 2 is a schematic perspective view of a chip coil formed of a thick-film multi-layer circuit substrate of the present invention.
Figure 3:
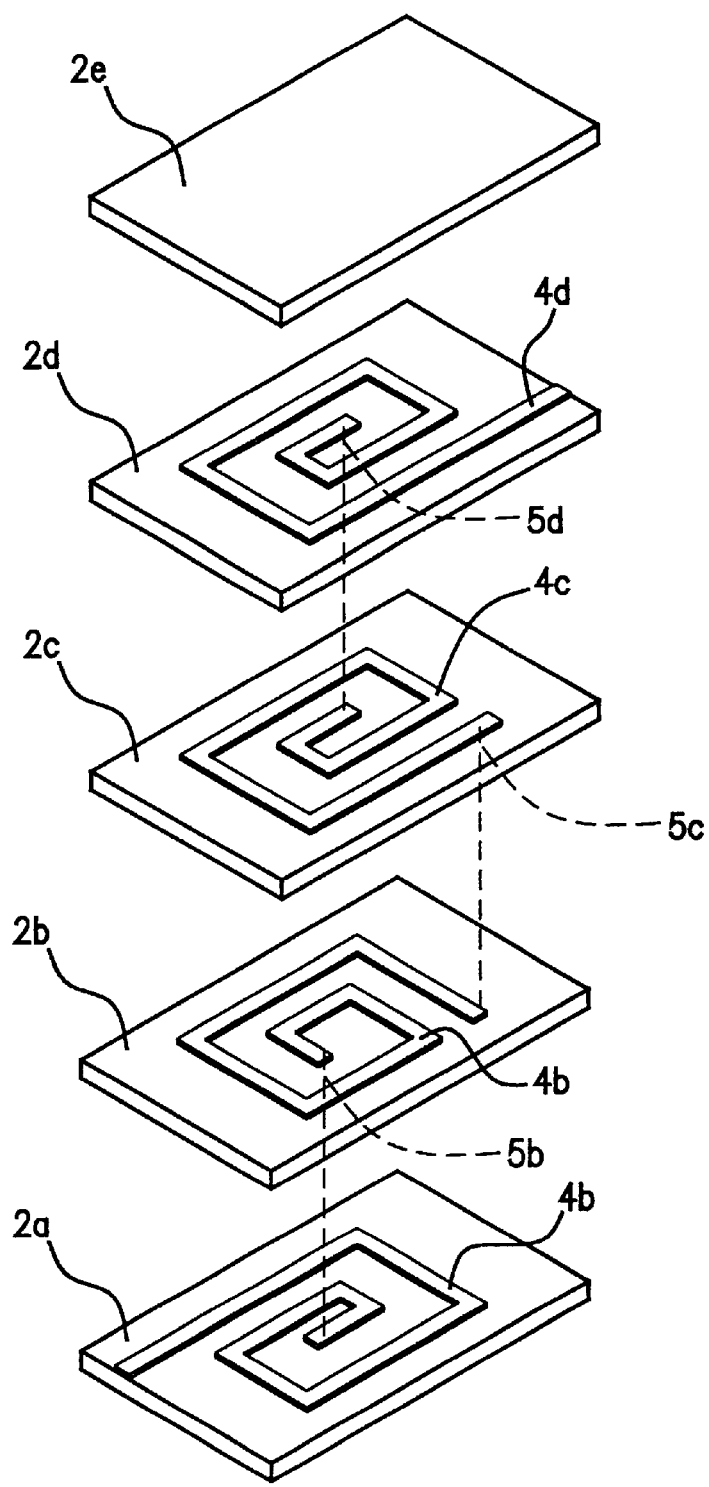
FIG. 3 is an exploded perspective view of the chip coil shown in FIG. 2.

As is shown in FIGS. 2 and 3, a chip coil 1 comprises a substrate 2 containing an insulating substrate 2a and insulating layers 2b, 2c, 2d and 2e successively formed on the insulating substrate 2a through thick-film printing; external electrodes 3a and 3b disposed at the respective longitudinal ends of the substrate 2; and internal electrodes 4a, 4b, 4c and 4d, having predetermined circuit patterns inside the substrate.

Accordingly, within the substrate 2, the internal electrodes 4a, 4b, 4c and 4d having predetermined coil patterns are provided between the insulating substrates 2a and 2b, 2b and 2c, 2c and 2d, and 2d and 2e, respectively. The internal electrode 4a provided between the insulating substrates 2a and 2b and the internal electrode 4d provided between the insulating substrates 2d and 2e are connected to the external electrodes 3a and 3b, respectively.

In addition, the internal electrode 4a (corresponding to the above-described first conductive layer) provided between the insulating substrates 2a and 2b is electrically connected to the internal electrode 4b (corresponding to the above-described second conductive layer) provided between the insulating substrates 2b and 2c with the mediation of via holes formed on the insulating substrate 2b, which holes are not shown in the Figs. In similar fashion, the internal electrodes 4b and 4c are electrically connected to the internal electrodes 4c and 4d, respectively, with the mediation of via holes (not shown in the Figs.) formed on the insulating substrates 2c and 2d, respectively.

In this case, the insulation layers 2b, 2c, 2d and 2e are formed through sintering of the above-described photosensitive insulating paste of the present invention, and thus the via holes having micro-size and good shape are formed through exposure and development. The coefficients of thermal expansion of the insulating layers 2b, 2c, 2d and 2e can be set to appropriate values in accordance with those of the insulating substrate 2a and the internal electrodes 4a to 4d, and thus, good conduction is provided between the internal electrodes and the camber of the substrate 2 is suppressed. Therefore, the chip coil 1 can be produced to have high reliability, wherein the density of the circuit patterns is increased.

In addition, even when an Ag-type conductive material is used in the circuit patterns, the Ag-type conductive material has very low reactivity with respect to the insulating layers 2b, 2c, 2d and 2e of the present invention, and therefore the insulating layer can be formed to have high reliability. Furthermore, even when the insulating material does not undergo any treatment for stabilization, the viscosity of the photosensitive insulating paste rarely deteriorates with passage of time and consistent patterns can be formed.

The thick-film multi-layer circuit substrate of the present invention is not limited to the above-described chip coil 1, and is applicable to electronic components for high-frequency circuits, such as a chip capacitor and a chip LC filter, as well as to high-frequency circuit substrates including high-frequency modules, such as VCO (Voltage Controlled Oscillators) and PLLs (Phase Locked Loops).

An example process for producing the chip coil 1 will next be described.

As is shown in FIG. 3, a photosensitive conductive paste is applied to the insulating substrate 2a containing alumina or a similar material. After the substrate is dried, the photosensitive paste is exposed to light via a photo-mask to thereby form a desired pattern. Subsequently, the paste is developed for removal of unnecessary conductive portions, and is sintered, for example, in air at 850° C. for one hour, to thereby form the internal electrode 4a having a spiral shape.

An example of the photosensitive conductive paste which may be used is Fordel K3714 (product of DuPont). The paste may be applied through screen printing, spin-coating or a doctor-blade method.

Subsequently, the photosensitive insulating paste of the present invention is applied to the insulating substrate 2a so as to cover the internal electrode 4a to thereby form a photosensitive insulating paste layer. After the paste layer is dried, the layer is exposed to light via a photo-mask to thereby form patterns for via holes having a diameter of 50 $\mu$m. The layer is then developed for removal of unnecessary portions and is sintered in air at a predetermined temperature for a predetermined time to thereby form the insulating layer 2b having pores for via holes (not shown in FIG. 3). The photosensitive insulating paste may be applied through screen printing, spin-coating or a doctor-blade method.

Subsequently, a conductive paste is charged into the pores for via holes and dried to thereby form via holes (not shown in FIG. 3) on the insulating layer 2b, which via holes connect one end of the internal electrode 4a with one end of the internal electrode 4b. After formation of the via holes, the internal electrode 4b having a spiral shape is formed in the same manner as described above.

Subsequently, in the same manner as described above, the photosensitive insulating paste of the present invention is applied to the insulating layer 2b so as to cover the internal electrode 4b to thereby form a photosensitive insulating paste layer. After the paste layer is dried, the layer is exposed to light via a photo-mask to thereby form patterns for via holes having a diameter of 50 $\mu$m. The layer is developed for removal of unnecessary portions and is sintered in air at a predetermined temperature for a predetermined time to thereby form the insulating layer 2c having pores for via holes (not shown in FIG. 3).

Subsequently, a conductive paste is charged into the pores for via holes and dried to thereby form via holes (not shown in FIG. 3) on the insulating layer 2c, which via holes connect one end of the internal electrode 4b with one end of the internal electrode 4c. After formation of the via holes, the internal electrode 4c having a spiral shape is formed in the same manner as described above.

Furthermore, in the same manner as described above, the photosensitive insulating paste of the present invention is applied to the insulating layer 2c so as to cover the internal electrode 4c to thereby form a photosensitive insulating paste layer. After the paste layer is dried, the layer is exposed to light via a photo-mask to thereby form patterns for via holes having a diameter of, for example, 50 $\mu$m. The layer is developed for removal of unnecessary portions and is sintered in air at a predetermined temperature for a predetermined time to thereby form the insulating layer 2d having pores for via holes (not shown in FIG. 3).

Subsequently, a conductive paste is charged into the pores for via holes and dried to thereby form via holes (not shown in FIG. 3) on the insulating layer 2d, which via holes connect one end of the internal electrode 4c with one end of the internal electrode 4d. After the formation of the via holes, the internal electrode 4d having a spiral shape is formed in the same manner as described above.

Subsequently, the photosensitive insulating paste of the present invention is applied to the insulating layer 2d so as to cover the internal electrode 4d to thereby form a photosensitive insulating paste layer. After the paste layer is dried, the layer is sintered in air at a predetermined temperature for a predetermined time to thereby form the insulating layer 2e for protection. In addition, the external electrodes 3a and 3b are provided to thereby obtain the chip coil 1 having a monolithic structure containing the internal electrodes of spiral shape and the insulating layers.

In the above-described production process, the photosensitive insulating paste of the present invention is used for forming the insulating layers 2b, 2c, 2d and 2e, and therefore, micro-via holes having a good shape can be formed with ease.

The viscosity of the photosensitive insulating paste of the present invention used for the formation of the insulating layers 2b, 2c, 2d and 2e hardly decreases with passage of time and thus bleeding attributed to deterioration of viscosity may be suppressed. In addition, micro-via holes having a diameter of less than 150 $\mu$m, particularly 50 $\mu$m or less, may be formed at high accuracy, and thus circuit substrates and electronic components for a circuit having a small size and high density can be obtained.

In the above-described production process of the chip coil, the internal electrodes 4a to 4d may be formed through screen printing by use of a typical conductive paste or through photolithography by use of a photo-resist. In addition, electronic components for high-frequency circuits such as chip capacitors and chip LC filters, and high-frequency circuit substrates including high-frequency modules such as VCOs and PLLs can be produced in substantially the same manner as described above.

EXAMPLES

Example 1

$SiO_2$, $B_2O_3$ and $K_2CO_3$ were procured as starting materials for preparing a borosilicate glass powder and were mixed in appropriate amounts so as to attain respective compositions shown in Table 1. Each of the resultant mixtures was melted at 1500–1750° C. so as to obtain molten glass. The molten glass was quenched by use of a quenching roller and ground to thereby obtain a borosilicate glass powder. In this case, three types of the powder, which are represented by glasses a, b and c, were obtained.

TABLE 1

| Glass No. | Composition of borosilicate glass powder | | | Melting temperature (° C.) | Glass softening point (° C.) |
|---|---|---|---|---|---|
| | $SiO_2$ | $B_2O_3$ | $K_2O$ | | |
| a | 65 | 35 | 0 | 1500 | 680 |
| b | 85 | 0 | 15 | 1750 | 1050 |
| c | 79 | 19 | 2 | 1600 | 800 |

The borosilicate glass powder and a crystalline $SiO_2$ powder were blended in appropriate amounts so as to attain respective compositions shown in Table 2 and the resultant mixture was wet-mixed by use of a zirconia ball mill for 3–4 hours so as to obtain a homogeneous powder mixture of the borosilicate glass powder and the crystalline $SiO_2$ powder. Subsequently, an organic binder and an organic solvent (toluene) were added to the powder mixture, followed by thorough kneading by use of a ball mill so as to obtain uniform dispersion. In addition, the thus-obtained dispersion was degassed under reduced pressure to thereby obtain a slurry for producing green sheets.

The thus-obtained slurry for green sheets was cast onto a film by use of a doctor blade to thereby form green sheets having a thickness of 0.2 mm. The green sheets were brought to dryness, peeled off the films and punched to thereby obtain ceramic green sheets of a predetermined size.

Subsequently, a plurality of the thus-obtained ceramic green sheets were placed one on another and press-formed to thereby obtain a ceramic compact. The thus-prepared ceramic compacts were heated at a temperature elevation rate of 200° C./hr and fired at respective temperatures shown in Table 2 for two hours to thereby obtain sintered ceramic products represented by Sample Nos. 1 to 15.

TABLE 2

| Sample No. | Glass No. | Composition (wt. %) | | Firing temperature (° C.) |
|---|---|---|---|---|
| | | Borosilicate glass powder | Crystalline $SiO_2$ powder | |
| 1 | a | 100 | 0 | 1000 |
| 2 | a | 95 | 5 | 1000 |
| 3 | a | 60 | 40 | 1000 |
| 4 | a | 50 | 50 | 1000 |
| 5 | a | 10 | 90 | 1000 |
| 6 | b | 100 | 0 | 1000 |
| 7 | b | 95 | 5 | 1000 |
| 8 | b | 60 | 40 | 1000 |
| 9 | b | 50 | 50 | 1000 |
| 10 | b | 10 | 90 | 1000 |
| 11 | c | 100 | 0 | 1000 |
| 12 | c | 95 | 5 | 1000 |
| 13 | c | 60 | 40 | 1000 |
| 14 | c | 50 | 50 | 1000 |
| 15 | c | 10 | 90 | 1000 |

The sintered ceramic products of Sample Nos. 1 to 15 were evaluated for relative dielectric constant (εr) and Q value at a frequency of 1 MHZ or 3 GHz. In addition, the sintered ceramic products were evaluated for insulating reliability (insulation resistance logIR), sintering capability at 1000° C. or less and percentage of crystalline $SiO_2$ in the ceramic product after sintering.

In this case, samples of the sintered ceramic product having a size of 50 mm×50 mm×0.635 mm were prepared. Relative dielectric constant εr and Q value were evaluated for each sample by use of an LCR under the following conditions: frequency 1 MHZ, voltage 1 Vrms and temperature 25° C. In addition, relative dielectric constant and Q value were evaluated for each sample through a method involving perturbation at 3 GHz. Insulating reliability (insulation resistance logIR) was evaluated for each sample by the application of a direct current voltage of 100 V for one minute after a voltage of 100 V had been applied to the sample for 1,000 hours at 85° C. and 85% RH. Percentage of crystalline $SiO_2$ in the sintered ceramic product was evaluated through X-ray diffraction and observation of cross section. The results are shown in Table 3.

TABLE 3

| Sample No. | Glass No. | Frequency 1 MHZ | | Frequency 3 MHZ | | Insulation Resistance | Sintering at | *Crystalline |
|---|---|---|---|---|---|---|---|---|
| | | εr | Q value | εr | Q value | LogIR | 1,000° C. or less | $SiO_2$ (wt. %) |
| 1 | a | 3.9 | 1000 | 3.9 | 400 | >9 | Possible | 0 |
| 2 | a | 3.9 | 1050 | 3.9 | 500 | >9 | Possible | 3 |
| 3 | a | 3.9 | 1250 | 3.8 | 800 | >9 | Possible | 38 |
| 4 | a | — | — | — | — | — | Not possible | 50 |
| 5 | a | — | — | — | — | — | Not possible | 85 |
| 6 | b | 6.2 | 350 | 6.2 | 200 | >9 | Possible | 0 |
| 7 | b | 5.9 | 450 | 5.8 | 400 | >9 | Possible | 4.5 |
| 8 | b | 4.5 | 700 | 4.4 | 470 | >9 | Possible | 39.5 |

TABLE 3-continued

| Sample No. | Glass No. | Frequency 1 MHZ $\epsilon r$ | Frequency 1 MHZ Q value | Frequency 3 MHZ $\epsilon r$ | Frequency 3 MHZ Q value | Insulation Resistance LogIR | Sintering at 1,000° C. or less | *Crystalline $SiO_2$ (wt. %) |
|---|---|---|---|---|---|---|---|---|
| 9 | b | — | — | — | — | — | Not possible | 50 |
| 10 | b | — | — | — | — | — | Not possible | 90 |
| 11 | c | 3.8 | 1000 | 3.8 | 700 | >9 | Possible | 0 |
| 12 | c | 3.8 | 1100 | 3.8 | 800 | >9 | Possible | 4.5 |
| 13 | c | 3.8 | 1400 | 3.8 | 1100 | >9 | Possible | 39 |
| 14 | c | — | — | — | — | — | Not possible | 50 |
| 15 | c | — | — | — | — | — | Not possible | 89 |

*"Crystalline $SiO_2$" refers to the percentage of crystalline $SiO_2$ in the sintered ceramic product.

As is apparent from Sample Nos. 1, 6 and 11, when the percentage of crystalline $SiO_2$ in the sintered ceramic product is less than 3 wt. %, the Q value becomes low at frequencies of 1 MHZ and 3 GHz. Meanwhile, when the percentage of crystalline $SiO_2$ in the sintered ceramic product is in excess of 40 wt. % as shown in Sample Nos. 4, 5, 9, 10, 14 and 15, sintering at 1,000° C. or less is not possible.

In contrast, as is apparent from Sample Nos. 2, 3, 7, 8, 12 and 13, when the percentage of crystalline $SiO_2$ falls within a range of 3–40 wt. %, the product has excellent electric characteristics, i.e., low relative dielectric constant $\epsilon r$ and high Q value, and has excellent insulating reliability, i.e., a high insulation resistance logIR of 9 or more. In addition, the product can be fired at a relatively low temperature of 1,000° C. or less. Sintering properties are also excellent.

Example 2

$SiO_2$, $B_2O_3$ and $K_2CO_3$ were procured as starting materials for preparing a borosilicate glass powder and were mixed in appropriate amounts so as to attain respective compositions shown in Table 4. The resultant mixture was melted at 1500–1750° C. so as to obtain molten glass. The molten glass was quenched by use of a quenching roller and ground to thereby obtain borosilicate glass powders represented by glasses a to k. Table 4 sets forth the melting temperatures and glass softening points of the borosilicate glass represented by glasses a to k.

TABLE 4

| Glass No. | Composition of borosilicate glass powder $SiO_2$ | $B_2O_3$ | $K_2O$ | Melting temperature (° C.) | Glass softening point (° C.) |
|---|---|---|---|---|---|
| a | 65 | 35 | 0 | 1500 | 680 |
| b | 85 | 0 | 15 | 1750 | 1050 |
| c | 79 | 19 | 2 | 1600 | 800 |
| d | 60 | 30 | 10 | 1500 | 700 |
| e | 85 | 15 | 0 | 1500 | 950 |
| f | 70 | 28 | 2 | 1500 | 720 |
| g | 75 | 23 | 2 | 1500 | 760 |
| h | 83 | 10 | 7 | 1500 | 950 |
| i | 65 | 20 | 15 | 1500 | 920 |
| j | 70 | 10 | 20 | 1500 | 710 |
| k | 90 | 5 | 5 | 1500 | >1050 |

The borosilicate glass powder and a crystalline $SiO_2$ powder were blended in appropriate amounts so as to attain the following composition: borosilicate glass powder/crystalline $SiO_2$ powder 60/40 (wt. %), and the resultant mixture was wet-mixed by use of a zirconia ball mill for 3–4 hours so as to obtain a homogeneous powder mixture of the borosilicate glass powder and the crystalline $SiO_2$ powder. Subsequently, an organic binder and an organic solvent (toluene) were added to the powder mixture, followed by thorough kneading by use of a ball mill so as to obtain uniform dispersion. In addition, the thus-obtained dispersion were degassed under reduced pressure to thereby obtain a slurry for green sheets.

The thus-obtained slurry for green sheets was cast onto a film by use of a doctor blade to thereby form green sheets having a thickness of 0.2 mm. The green sheets were brought to dryness, peeled off the film, and punched to thereby obtain ceramic green sheets of a predetermined size. Subsequently, a plurality of the thus-obtained ceramic green sheets were placed one on another and press-formed to thereby obtain a ceramic compact. The thus-prepared ceramic compacts were heated at a temperature elevation rate of 200° C./hr and fired at 1,000° C. for two hours to thereby obtain sintered ceramic products represented by Test Examples 1 to 11 shown in Table 5.

In the same manner of Example 1, the sintered ceramic products of Test Examples 1 to 11 were evaluated for relative dielectric constant $\epsilon r$ and Q value at frequencies of 1 MHZ and 3 GHz. In addition, the sintered ceramic products were evaluated for insulating reliability (insulation resistance logIR) and sintering capability at 1000° C. or less. The results are shown in Table 5.

TABLE 5

| Test Example No. | Glass No. | Borosilicate glass powder/Crystalline $SiO_2$ powder $\epsilon r$ | Q value | Insulation resistance logIR | Sintering at 1,000° C. or less | *Crystalline $SiO_2$ (wt. %) |
|---|---|---|---|---|---|---|
| 1 | a | 3.8 | 800 | >9 | Possible | 38 |
| 2 | b | 4.4 | 470 | >9 | Possible | 39.5 |

TABLE 5-continued

| Test Example No. | Glass No. | $\epsilon r$ | Q value | Insulation resistance logIR | Sintering at 1,000° C. or less | *Crystalline $SiO_2$ (wt. %) |
|---|---|---|---|---|---|---|
| 3 | c | 3.8 | 1100 | >9 | Possible | 39 |
| 4 | d | 4.2 | 400 | <9 | Possible | 38 |
| 5 | e | 3.8 | 1100 | >9 | Possible | 39 |
| 6 | f | 3.9 | 1000 | >9 | Possible | 38 |
| 7 | g | 3.8 | 1000 | >9 | Possible | 38.5 |
| 8 | h | 4.2 | 400 | >9 | Possible | 39 |
| 9 | i | 4.6 | 350 | >9 | Possible | 39 |
| 10 | j | 4.6 | 300 | >9 | Possible | 38 |
| 11 | k | — | — | — | Not Possible | 40 |

*"Crystalline $SiO_2$" refers to the percentage of crystalline $SiO_2$ in the sintered ceramic product.

As is apparent from Test Example 4 in Table 5, when a borosilicate glass of the compositional proportions of the components in a region X shown in FIG. 1 is used, the product has an insulation resistance of less than $1 \times 10^9$ (logIR<9), i.e., low insulating reliability. As is apparent from Test Example 10, when a borosilicate glass of the compositional proportions of the components in a region Y shown in FIG. 1 is used, the product has high relative dielectric constant $\epsilon r$ and very low Q value, and thus, high-frequency characteristics of relative dielectric constant $\epsilon r$ and Q value deteriorate. In addition, as is apparent from Test Example 11, when a borosilicate glass of the compositional proportions of the components in a region Z shown in FIG. 1 is used, sintering at 1,000° C. or less is difficult.

In contrast, as is apparent from Test Examples 1 to 3 and 5 to 9, when a borosilicate glass powder of the compositional proportions of the components in a region formed by connecting points A, B, C and D shown in FIG. 1 is used, sintering at 1,000° C. or less is possible, and the products have an insulation resistance of $1 \times 10^9$ or more (logIR>9), i.e., high insulating reliability. In addition, the products have excellent high-frequency characteristics, i.e., low relative dielectric constant $\epsilon r$ and high Q value.

For comparison, the procedure of Example 2 was repeated, except that only a borosilicate glass powder was added to the organic binder and organic solvent and mixed to thereby obtain the sintered ceramic products represented by Test Examples 12 to 22 in Table 6.

In the same manner of Example 2, the sintered ceramic products of Test Examples 12 to 22 were evaluated for relative dielectric constant $\epsilon r$ and Q value at frequencies of 1 MHZ and 3 GHz. In addition, the sintered ceramic products were evaluated for insulating reliability (insulation resistance logIR) and sintering capability at 1000° C. or less. The results are shown in Table 6.

TABLE 6

| Test Example No. | Glass No. | $\epsilon r$ | Q value | Insulation resistance logIR | Sintering at 1,000° C. or less |
|---|---|---|---|---|---|
| 12 | a | 3.9 | 400 | >9 | Possible |
| 13 | b | 6.2 | 200 | >9 | Possible |
| 14 | c | 3.8 | 700 | >9 | Possible |
| 15 | d | 5.3 | 200 | <9 | Possible |
| 16 | e | 3.7 | 800 | >9 | Possible |
| 17 | f | 4.1 | 800 | >9 | Possible |
| 18 | g | 4 | 700 | >9 | Possible |
| 19 | h | 5.7 | 300 | >9 | Possible |
| 20 | i | 6.1 | 200 | >9 | Possible |
| 21 | j | 7 | 200 | >9 | Possible |
| 22 | k | — | — | — | Not possible |

As is apparent from Test Examples 1 to 11 in Table 5 and Test Examples 12 to 22 in Table 6, the sintered ceramic product containing a borosilicate glass powder and a crystalline $SiO_2$ powder in appropriate amounts has lower relative dielectric constant $\epsilon r$ and higher Q value compared with the sintered ceramic product containing only a borosilicate glass powder.

Example 3

$SiO_2$, $B_2O_3$ and $K_2O$ were procured as starting materials for preparing a borosilicate glass powder contained in a photosensitive insulating paste and were mixed in appropriate amounts so as to attain the following composition: $SiO_2/B_2O_3/K_2O=79/19/2$ (wt. %). The resultant mixture was melted at 1500–1700° C. so as to obtain molten glass. The molten glass was quenched by use of a quenching roller and ground to thereby obtain borosilicate glass powders having a mean particle size of 3.0 μm. Meanwhile, a crystalline $SiO_2$ powder was ground in a ball-mill to thereby obtain $SiO_2$ powders having a mean particle size of 3.0 μm. In addition, the thus-obtained borosilicate glass powders and crystalline $SiO_2$ powders were sprayed in a high temperature atmosphere and quenched.

In this case, the number of steps for quenching was varied in a range of 1 to 5 to thereby obtain borosilicate glass powders and crystalline $SiO_2$ powders having a variety of shape-smoothness indexes. More specifically, Test Examples 23, 24, 25, 26 and 27 shown in Table 7 were subjected to quenching in one, two, three, four and five steps, respectively, in order to reduce surface irregularities.

Shape-smoothness index was determined as described below. The ratio of surface area to weight SS ($m^2/g$), the ratio of surface area to volume CS ($m^2/cc$), and specific gravity ρ were measured by use of an inert-gas-adsorbing automatic surface area meter, a laser Doppler analysis particle size distribution meter, and a specific gravity meter, respectively. Subsequently, ρ×SS/CS was calculated from the above results the thus-calculated value was used as shape-smoothness index of a borosilicate glass powder and a crystalline $SiO_2$ powder.

Subsequently, in a room equipped with a yellow fluorescent lamp, a borosilicate glass powder, a crystalline $SiO_2$ powder and a photocurable composition of PER-800 series (product of GOO CHEMICAL CO., LTD.) containing an organic binder, a photopolymerization initiator and a photocurable monomer were mixed in appropriate amounts so as to attain the following composition: borosilicate glass powder/crystalline $SiO_2$ powder/photocurable composition= 40/10/50 (wt. %). The resultant mixture was kneaded by use of a stirrer and a three-roll mill to thereby prepare a photosensitive insulating paste containing the borosilicate glass powder and the crystalline $SiO_2$ powder, which powders have the predetermined shape-smoothness indexes shown in Table 7.

The respective photosensitive insulating pastes of Test Examples 23 to 27 were applied through screen printing to the entire surface of an insulating substrate having an electrode of predetermined shape to thereby form a photosensitive insulating paste layer. In this case, stainless mesh #325 was used as a screen printing plate. Screen printing was performed under the following conditions: squeegee pressure 5 kg/cm$^2$, squeegee speed 50 mm/second, angle of attack 70° and screen distance 1.5 mm.

After the photosensitive insulating paste was applied to the insulating substrate, the paste was subjected to leveling for 10 minutes or more and dried in a drying apparatus at 90° C. for 60 minutes to thereby vaporize the solvent component in the paste. Subsequently, the substrate was taken out of the apparatus, the surface temperature of the substrate was confirmed to reach room temperature ±2° C., and the substrate was confirmed to have the same size as before drying. The substrate was exposed to UV rays of 200 mj/cm$^2$ by use of an exposure apparatus equipped with a photo-mask to thereby form via holes having a diameter of 50 μm. Proximity exposure was used as the exposure method. After exposure, any region on the substrate which had not been exposed was removed by use of a spray-shower-type developing apparatus. A 0.5 wt. % aqueous solution of sodium carbonate was used as a developing solution.

After developing, the substrate was washed with water and dried again in a drying apparatus for 30 minutes to thereby evaporate the water thoroughly. Subsequently, the photosensitive insulating paste layer was fired in a belt-type firing apparatus under the following conditions: heating rate 50° C./minute, maximum temperature 900° C., retention time at maximum firing temperature 10 minutes and cooling rate 50° C./minute, to thereby form an insulating layer on the insulating substrate.

A method for evaluation of the insulating layer on the insulating substrate will next be described in more detail.

Figure 4:
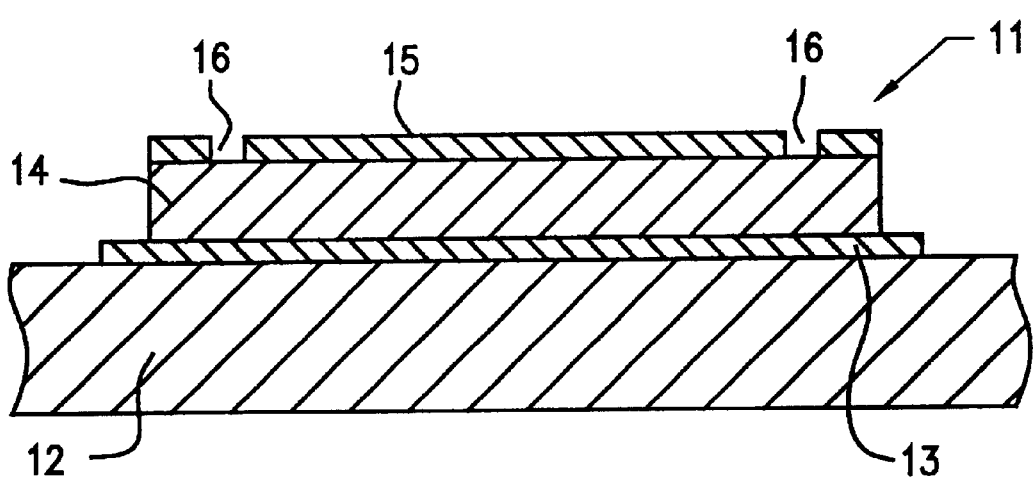
FIG. 4 is a schematic sectional view of a thick-film multi-layer circuit substrate used for evaluation in the examples of the present invention.

As is shown in FIG. 4, an alumina substrate having a thickness of 0.635 mm and a surface area of 10 cm×10 cm was prepared as an insulating substrate 12. On the substrate 12, a conductive paste predominantly containing Ag/Pt was applied through screen printing and the paste layer was fired in air at 850° C. to thereby form a disk-shaped conductive undercoat layer 13 having a film thickness of about 8 μm and a diameter of 8 mm, which layer served as one electrode of a capacitor.

Subsequently, the above-prepared respective photosensitive insulating pastes were applied to the conductive undercoat layer through screen printing and the paste layer was exposed to UV rays of 50 mj/cm$^2$ by means of photolithography to thereby obtain predetermined patterns, and the resultant layer was developed. In addition, the thus-obtained layer was fired in air at the temperature shown in Table 2 to thereby form a disk-shaped insulating layer 14 having a film thickness of about 40 μm and a diameter of 6 mm.

Next, a conductive paste predominantly containing Ag was applied to the insulating layer 14 through screen printing and the paste was and fired in air to thereby form a conductive overcoat layer 15 having a diameter of 4 mm, which layer has guards 16 having a width of 500 μm along and serves as the other electrode of a capacitor. Through the above-described procedure, a thick-film multi-layer circuit substrate 11 was completed.

Characteristics of the insulating layer 14 were assessed through measurement of characteristics of a capacitor containing the conductive undercoat layer 13 and the conductive overcoat layer 15 as counter electrodes and the insulating layer 14 as a dielectric layer. In this case, the capacitor was isolated from the surroundings by use of a guard electrode, and capacitance of the capacitor was measured under the following conditions: frequency 1 MHZ, voltage 1 Vrms and temperature 25° C. Relative dielectric constant (εr) and Q value were obtained from the above-measured capacitance and the size of the capacitor.

The insulating layers formed of the respective photosensitive insulating pastes according to Test Examples 23 to 27 were subjected to exposure treatment and development in the same manner described above to thereby form via holes having a diameter of 50 μm. The shape and taper of the via holes were assessed as follows.

The shape of the via holes having a diameter of 50 μm was observed from the top side under a microscope, and roundness of each hole was assessed by use of ratings AA, BB, CC and DD indicating roundness in sequence from good to poor. In the case in which a hole has significant irregularity and its shape is far from round, a rating DD was assigned. In order to assess the taper of the via hole having a diameter of 50 μm, difference in diameter between the upper side and the lower side of the sectional-view of the hole was obtained by use of a microscopic-length measuring apparatus. The thus-obtained difference was assessed in terms of the following expressions "very large," "large," "small" and "very small." The results are shown in Table 7.

TABLE 7

| Test Example No. | Shape smoothness index | Shape of via holes | Taper of via holes | εr 1MHz | Q value 1MHz |
|---|---|---|---|---|---|
| 23 | 3.8 | DD | Very large | 3.6 | 700 |
| 24 | 3.2 | CC | Large | 3.7 | 800 |
| 25 | 2.8 | BB | Small | 3.8 | 1100 |
| 26 | 1.7 | AA | Very small | 3.8 | 1400 |
| 27 | 1.3 | AA | Very small | 3.8 | 1500 |

As is apparent from Table 7, as in the cases of Test Examples 23 and 24, when the shape-smoothness index of the borosilicate glass powder or the crystalline $SiO_2$ is in excess of 3.0, the via holes have poor shape and tend to have a large taper. The reason is that the inorganic powder particle of a large shape-smoothness index has relatively large irregularity on the surface, and therefore, when the particle is exposed to light, a large amount of active rays, for example, rays in a UV region, are scattered from the surface of the particle. As a result, it is difficult to form via holes having high roundness and low taper.

In contrast, as in the cases of Test Examples 25 to 27, when the shape-smoothness index is 3.0 or less, the irregularity of the inorganic particle is suppressed on the surface. Therefore, when the particle is exposed to light, the amount of scattered active rays becomes low and via holes having high roundness and small taper can be formed. Particularly, as in the cases of Test Examples 26 and 27, when the shape-smoothness index is 1.0–2.0, the shape of via hole further improves. In addition, as is apparent from Table 7, the sintered product formed from the particles has higher density and has a Q value as high as 1400 or more at 1 MHZ.

As is described above, the shape-smoothness index of the borosilicate glass powder and the crystalline $SiO_2$ powder is preferably about 1.0–3.0, more preferably about 1.0–2.0, which index is obtained by the following formula: $\rho \times SS/CS$ wherein SS represents the ratio of surface area to weight, CS represents the ratio of surface area to volume, and $\rho$ represents specific gravity.

Example 4

$SiO_2$, $B_2O_3$ and $K_2O$ were procured as starting materials for preparing a borosilicate glass powder contained in a photosensitive insulating paste and were mixed in appropriate amounts so as to attain the following composition: $SiO_2/B_2O_3/K_2O=79/19/2$ (wt. %). The resultant mixture was melted at 1700° C. so as to obtain molten glass. The molten glass was quenched by use of a quenching roller and ground to thereby obtain borosilicate glass powders having mean particle sizes of 7.3 μm (Test Example 28), 5.5 μm (Test Example 29), 4.8 μm (Test Example 30), 0.1 μm (Test Example 31) and 0.05 μm (Test Example 32).

Meanwhile, a crystalline $SiO_2$ powder was ground in a ball-mill to thereby obtain $SiO_2$ powders having mean particle sizes of 7.3 μm (Test Example 28), 5.5 μm (Test Example 29), 4.8 μm (Test Example 30), 0.1 μm (Test Example 31) and 0.05 μm (Test Example 32). Subsequently, the above-obtained borosilicate glass powders and the crystalline $SiO_2$ powders were sprayed in a high-temperature atmosphere to thereby form the borosilicate glass powders and the crystalline $SiO_2$ powders having a shape-smoothness index of 1.7.

Subsequently, in a room equipped with a yellow fluorescent lamp, the borosilicate glass powder, the crystalline $SiO_2$ powder and a photocurable composition of PER-800 series (product of GOO CHEMICAL CO., LTD.) containing an organic binder, a photopolymerization initiator and a photocurable monomer were mixed in appropriate amounts so as to attain the following composition: borosilicate glass powder/crystalline $SiO_2$/photocurable composition=40/10/50 (wt. %). The resultant mixture was kneaded by use of a stirrer and a three-roll mill to thereby prepare a photosensitive insulating paste.

Subsequently, the photosensitive insulating pastes of Test Examples 28 to 32 were successively subjected to screen printing, drying, exposure, development, washing with water, drying and firing in the same manner as described in Example 3 to thereby form insulating layers on insulating substrates.

The thus-obtained insulating layers of Test Examples 28 to 32 were assessed for the shape and taper of via holes having a diameter of 50 μm, and dielectric breakdown voltage based on a film-thickness of 25 μm in the same manner as described in Example 3. The results are shown in Table 8.

TABLE 8

| Test Example No. | Mean particle size (μm) | Shape of via holes | Taper of via holes | Dielectric breakdown voltage (kV/25 mm) |
|---|---|---|---|---|
| 28 | 7.3 | CC | Large | 2.26 |
| 29 | 5.5 | CC | Large | 3.29 |
| 30 | 4.8 | BB | Small | 5.18 |
| 31 | 0.1 | BB | Very small | 5.54 |
| 32 | 0.05 | CC | Large | 6.32 |

As is apparent from Table 8, when the mean particle size of the borosilicate glass powder or the crystalline $SiO_2$ is in excess of 5.0 μm as in the cases of Test Examples 28 and 29, dielectric breakdown voltage tends to become low. Meanwhile, when the mean particle size of the powder is less than 0.1 μm as in the case of Test Example 32 via holes having high roundness and low taper tend to be difficult to form. Active rays are absorbed in the powder particles and insufficient amounts of rays are applied to the surface of the substrate and thus photopolymerization may be inhibited. In addition, when the particle size of the powder is less than 0.1 μm, the density of the insulating layer may decrease and the film may be peeled off during development.

In contrast, when the mean particle size of the borosilicate glass powder or the crystalline $SiO_2$ powder falls within a range of about 0.1–5.0 μm as in the cases of Test Examples 30 and 31, high dielectric breakdown voltage can be obtained and via holes having high roundness and low taper can be formed.

As is described above, the mean particle size of the borosilicate glass powder or the crystalline $SiO_2$ powder preferably falls within a range of about 0.1–5.0 μm.

Example 5

$SiO_2$, $B_2O_3$ and $K_2O$ were procured as starting materials for preparing a borosilicate glass powder contained in a photosensitive insulating paste and were mixed in appropriate amounts so as to attain the following composition: $SiO_2/B_2O_3/K_2O=79/19/2$ (wt. %). The resultant mixture was melted at 1700° C. so as to obtain molten glass. The molten glass was quenched by use of a quenching roller and ground to thereby obtain borosilicate glass powders having a mean particle size of 2.8 μm. Meanwhile, a crystalline $SiO_2$ powder was ground in a ball-mill to thereby obtain $SiO_2$ powders having a mean particle size of 2.8 μm. In addition, the thus-obtained borosilicate glass powders and crystalline $SiO_2$ powders were sprayed in a high-temperature atmosphere to thereby form the borosilicate glass powders and the crystalline $SiO_2$ powders having a shape-smoothness index of 2.0.

Subsequently, in a room equipped with a yellow fluorescent lamp, the borosilicate glass powder, the crystalline $SiO_2$ powder and a photosensitive organic vehicle of PER-800 series (photocurable composition) (product of GOO CHEMICAL CO., LTD.) containing an organic binder, a photopolymerization initiator and a photocurable monomer were mixed in appropriate amounts so as to attain the following composition: borosilicate glass powder/crystalline $SiO_2$/photocurable composition=40/10/50 (wt. %). In this case, the compositional ratio of acryl to modified cellulose was 2/1 to 12/1 in the organic vehicle. The resultant mixture was kneaded by use of a stirrer and a three-roll mill to thereby prepare photosensitive insulating pastes of Test Examples 33 to 37 shown in Table 9.

Subsequently, the thus-prepared photosensitive insulating pastes were successively subjected to screen printing, drying, exposure, development, washing with water, drying and firing in the same manner as described in Example 3 to thereby form insulating layers on insulating substrates.

The thus-obtained insulating layers of Test Examples 33 to 37 were assessed for the shape and deformation of via holes having a diameter of 50 μm and film strength of the dried film in the same manner as described in Example 3. The results are shown in Table 9.

In order to assess the deformation of the via holes having a diameter of 50 μm, difference in diameter between the upper side and the lower side of the sectional-view of the hole was obtained by use of a microscopic-length measuring apparatus. The thus-obtained difference was assessed in terms of the following expressions "very large," "large," "small," and "very small." Meanwhile, the film strength of the dried film was assessed in terms of ratings AA, BB, CC and DD in sequence from good to poor, on the basis of the results of a cross-cut tape peeling test.

TABLE 9

| Test Example No. | *Compositional ratio | Shape of via holes | Deformation of via holes | Strength of dried film |
|---|---|---|---|---|
| 33 | 2/1 | DD | Large | AA |
| 34 | 3/1 | BB | Small | AA |
| 35 | 4/1 | BB | Small | AA |
| 36 | 10/1 | AA | Very small | BB |
| 37 | 12/1 | AA | Very small | CC |

*The term "Compositional ratio" refers to the ratio of acryl to modified cellulose.

As is apparent from Table 9, when the compositional ratio of modified cellulose is larger as in the case of Test Example 33 as compared with the ratio of acryl to modified cellulose= 3/1 in an acryl/modified cellulose copolymer in the organic vehicle, via holes tend to have poor shape and high degree of deformation. This tendency may be attributed to absorption of active rays by modified cellulose. As in the case of Test Example 37, when the compositional ratio of acryl is larger as compared with a ratio of acryl/modified cellulose= 10/1, the dried film has poor adhesion to the insulating layer and film-strength tends to become low.

In contrast, as in the cases of Test Examples 34, 35, and 36, when the compositional ratio of acryl/modified cellulose falls within a range of about 3/1–10/1, via holes have good shape and low degree of deformation. In addition, the photosensitive insulating paste layer, i.e., the insulating layer having high film-strength after drying, can be formed.

As is apparent from the above results, an organic binder containing an acrylic copolymer having a carboxyl group and an ethylenic unsaturated group in side chains is preferably used as an organic binder in the photosensitive insulating paste, such that unexposed regions are dissolved and removed by use of a developer formed of a weak alkali aqueous solution. In addition, the compositional ratio of acryl/modified cellulose in the copolymer preferably falls within a range of about 3/1–10/1 in order to enhance adhesion between the insulating layer and the substrate.

Example 6

Table 10 shows change in viscosity of the photosensitive insulating paste of Test Example 35 shown in Table 9 in accordance with time. In this case, the viscosity (in Pa·s) was measured at 1, 10 and 50 rpm by use of a Brookfield viscometer and the rotation speed was adjusted before every measurement.

TABLE 10

| Elapsed time | Rotational speed | | |
|---|---|---|---|
| (Days) | 1 rpm | 10 rpm | 50 rpm |
| 1 | 51.4 | 27.3 | 20.2 |
| 3 | 50.2 | 27.5 | 19.7 |
| 7 | 51.3 | 27.6 | 21.5 |
| 30 | 50.0 | 28.4 | 20.8 |
| 50 | 52.3 | 28.2 | 20.4 |

As is apparent from Table 10, the viscosity of the photosensitive insulating paste of Test Example 35 is very stable after 50 days. The photosensitive insulating paste of the test example contains a large amount of an $SiO_2$ component which has low reactivity with an organic binder and another component which also has low reactivity with the organic binder. Therefore, the viscosity of the paste hardly changes with passage of time, the film can be formed consistently and micro-via holes can be formed through photolithography.

As described above, the photosensitive insulating paste of the present invention contains a large amount of a crystalline $SiO_2$ powder. The $SiO_2$ powder has low reactivity with an organic binder, and therefore the viscosity of the paste hardly changes with passage of time, and the film can be formed consistently. In addition, micro-via holes can be formed with ease by means of photo lithography.

The thick-film multi-layer circuit substrate of the present invention contains insulating layers formed of the photosensitive insulating paste of the present invention. Therefore, the substrate has high Q value and low relative dielectric constant in good balance. In addition, micro-via holes having good shape can be formed by means of photolithography, and density of via holes and circuit patterns can be increased.

What is claimed is:

1. A thick-film multi-layer circuit substrate comprising the combination of an insulating substrate and a thick-film insulating layer wherein the insulating layer is an exposed and sintered photosensitive insulating paste comprising a borosilicate glass powder and a crystalline $SiO_2$ powder dispersed in a photosensitive organic vehicle, and wherein the sintered paste contains about 3–40 wt. % crystalline $SiO_2$.

2. A thick-film multi-layer circuit substrate according to claim 1, wherein the insulating layer is disposed between a first conductive layer and a second conductive layer, each of which conductive layers comprise a predetermined circuit patterns, and wherein the insulating layer contains at least one via hole electrically connecting the first conductive layer with the second conductive layer.

3. A thick-film multi-layer circuit substrate according to claim 1, wherein the borosilicate glass contains $SiO_2$, $B_2O_3$ and $K_2O$, with the compositional proportions of the three components represented by ($SiO_2$, $B_2O_3$, $K_2O$) falling within a region formed by connecting points A (65, 35, 0), B (65, 20, 15), C (85, 0, 15) and D (85, 15, 0) in a ternary diagram.

4. A thick-film multi-layer circuit substrate according to claim 3, wherein the insulating layer is disposed between a first conductive layer and a second conductive layer, each of which conductive layers comprise a predetermined circuit patterns, and wherein the insulating layer contains at least one via hole electrically connecting the first conductive layer with the second conductive layer.

5. A thick-film multi-layer circuit substrate according to claim 3, wherein the borosilicate glass powder and the crystalline $SiO_2$ powder each have a mean particle size of about 0.1–5 µm.

6. A thick-film multi-layer circuit substrate according to claim 5, wherein the organic vehicle contained an organic binder, a photopolymerization initiator and a photocurable monomer, and wherein the organic binder comprises an acrylic copolymer having a carboxyl group and an ethylenic unsaturated group in side chains of the copolymer.

7. A thick-film multi-layer circuit substrate according to claim 6, wherein the acrylic copolymer is an acrylic/modified-cellulosic copolymer.

8. A thick-film multi-layer circuit substrate according to claim 7, wherein the compositional ratio of the acrylic/modified-cellulosic copolymer is about 3/1–10/1.

9. A thick-film multi-layer circuit substrate according to claim 8, wherein the borosilicate glass powder and the crystalline $SiO_2$ powder have a shape-smoothness index ($\rho \times SS/CS$) of about 1.0–3.0, the ratio of surface area to weight being represented by SS ($m^2/g$), the ratio of surface area to volume being represented by CS ($m^2/cc$) and specific gravity being represented by $\rho$.

10. A thick-film multi-layer circuit substrate according to claim 9, wherein the insulating layer is disposed between a first conductive layer and a second conductive layer, each of which conductive layers comprise a predetermined circuit patterns, and wherein the insulating layer contains at least one via hole electrically connecting the first conductive layer with the second conductive layer.

11. A thick-film multi-layer circuit substrate according to claim 9, wherein the borosilicate glass powder and the crystalline $SiO_2$ powder have a shape-smoothness index ($\rho \times SS/CS$) of about 1.0–2.0.

12. A thick-film multi-layer circuit substrate according to claim 1, wherein the borosilicate glass powder and the crystalline $SiO_2$ powder each have a mean particle size of about 0.1–5 µm.

13. A thick-film multi-layer circuit substrate according to claim 1, wherein the organic vehicle contains an organic binder, a photopolymerization initiator and a photocurable monomer, and wherein the organic binder comprises an acrylic copolymer having a carboxyl group and an ethylenic unsaturated group in side chains of the copolymer.

14. A thick-film multi-layer circuit substrate according to claim 13, wherein the acrylic copolymer is an acrylic/modified-cellulosic copolymer.

15. A thick-film multi-layer circuit substrate according to claim 14, wherein the compositional ratio of the acrylic/modified-cellulosic copolymer is about 3/1–10/1.

16. A thick-film multi-layer circuit substrate according to claim 1, wherein the borosilicate glass powder and the crystalline $SiO_2$ powder have a shape-smoothness index ($\rho \times SS/CS$) of about 1.0–3.0, the ratio of surface area to weight being represented by SS ($m^2/g$), the ratio of surface area to volume being represented by CS ($m^2/cc$) and specific gravity being represented by $\rho$.

17. A thick-film multi-layer circuit substrate according to claim 16, wherein the borosilicate glass powder and the crystalline $SiO_2$ powder have a shape-smoothness index ($\rho \times SS/CS$) of about 1.0–2.

\* \* \* \* \*